(12) United States Patent
Chen et al.

(10) Patent No.: US 10,002,829 B2
(45) Date of Patent: Jun. 19, 2018

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Hao Chen, New Taipei (TW);
Chen-Hsiang Hsu, Taichung (TW);
Hung-Chih Lin, Hsinchu (TW);
Ching-Nen Peng, Hsinchu (TW);
Mill-Jer Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 14/954,207

(22) Filed: Nov. 30, 2015

(65) Prior Publication Data

US 2017/0154843 A1 Jun. 1, 2017

(51) Int. Cl.
| | | |
|---|---|---|
| *H01L 23/528* | (2006.01) | |
| *G01R 19/00* | (2006.01) | |
| *G01R 31/28* | (2006.01) | |
| *H01L 23/31* | (2006.01) | |
| *H01L 23/00* | (2006.01) | |
| *H01L 25/065* | (2006.01) | |
| *H01L 23/498* | (2006.01) | |

(52) U.S. Cl.
CPC ........ *H01L 23/528* (2013.01); *G01R 19/0092* (2013.01); *G01R 31/2831* (2013.01); *H01L 23/3107* (2013.01); *H01L 23/49827* (2013.01); *H01L 24/06* (2013.01); *H01L 24/09* (2013.01); *H01L 24/14* (2013.01); *H01L 24/17* (2013.01); *H01L 25/0655* (2013.01); *H01L 23/49816* (2013.01); *H01L 2224/02371* (2013.01); *H01L 2224/0401* (2013.01); *H01L 2224/12105* (2013.01); *H01L 2224/13024* (2013.01); *H01L 2924/2064* (2013.01)

(58) Field of Classification Search
CPC ... H01L 23/367; H01L 27/088; H01L 29/423; H01L 29/4175; H01L 23/528; H01L 23/3107; H01L 23/49827; H01L 24/06; H01L 24/09; H01L 24/14; H01L 24/17; H01L 25/0655
See application file for complete search history.

(56) References Cited

U.S. PATENT DOCUMENTS

| | | | | |
|---|---|---|---|---|
| 5,929,650 | A * | 7/1999 | Pappert ............... | G01R 31/3004 324/750.3 |
| 8,080,994 | B2 * | 12/2011 | Taylor .................. | G01R 15/207 324/252 |
| 2005/0024075 | A1 * | 2/2005 | Srivastava .......... | G01R 31/3008 324/762.02 |

(Continued)

*Primary Examiner* — Fazli Erdem
(74) *Attorney, Agent, or Firm* — WPAT, P.C., Intellectual Property Attorneys; Anthony King

(57) ABSTRACT

A semiconductor device is provided which comprises a semiconductive substrate and an interconnect on the substrate. The interconnect comprises a dielectric in an upper most level of the interconnect and a plurality of conductive pads where each of the plurality of conductive pads is at least partially exposed from the dielectric. The interconnect further includes a current sensor electrically coupled with at least one of the plurality of conductive pads.

20 Claims, 18 Drawing Sheets

(56) References Cited

U.S. PATENT DOCUMENTS

| | | | |
|---|---|---|---|
| 2006/0214675 A1* | 9/2006 | Stillman | G01R 1/07378 324/754.2 |
| 2007/0109003 A1* | 5/2007 | Shi | G01R 31/2831 324/750.3 |
| 2008/0018350 A1* | 1/2008 | Chao | G01R 1/07378 324/754.18 |
| 2008/0157396 A1* | 7/2008 | Yang | H01L 23/3128 257/778 |
| 2009/0250698 A1* | 10/2009 | Savithri | H01L 22/14 257/48 |
| 2010/0278211 A1* | 11/2010 | Pu | G01R 31/2875 374/57 |
| 2011/0210956 A1* | 9/2011 | Girdhar | H01L 27/088 345/212 |
| 2012/0206160 A1* | 8/2012 | Wu | G01R 31/2884 324/756.07 |
| 2012/0286814 A1* | 11/2012 | Wang | G01R 1/07378 324/754.03 |
| 2013/0147016 A1* | 6/2013 | Hauenstein | H01L 23/13 257/536 |
| 2013/0147032 A1* | 6/2013 | Jeng | H01L 23/49838 257/737 |
| 2013/0147505 A1* | 6/2013 | Wang | G01R 1/07342 324/755.01 |
| 2013/0295699 A1* | 11/2013 | Liu | H01L 22/14 438/17 |
| 2014/0203278 A1* | 7/2014 | Ossimitz | H01L 22/32 257/48 |
| 2014/0206109 A1* | 7/2014 | Ossimitz | H01L 22/10 438/15 |
| 2014/0253103 A1* | 9/2014 | Racz | G01R 1/0416 324/149 |
| 2014/0327464 A1* | 11/2014 | Wu | G01R 31/2884 324/756.07 |
| 2015/0076636 A1* | 3/2015 | Beer | G01R 19/0092 257/427 |
| 2016/0084882 A1* | 3/2016 | Dang | G01R 1/07314 324/754.03 |
| 2016/0084887 A1* | 3/2016 | Beer | G01R 15/146 324/126 |

* cited by examiner

SEMICONDUCTOR DEVICE AND MANUFACTURING METHOD THEREOF

BACKGROUND

Electronic equipment involving semiconductive devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

As technologies evolve, designs for devices become more complicated in view of smaller dimensions and an increase of functionality and the amount of circuitries. Numerous manufacturing operations are implemented within such a small and high performance semiconductor device. The manufacturing of the semiconductor device in a miniaturized scale becomes more complicated, and the increase in complexity of manufacturing may cause deficiencies such as high yield loss, poor reliability of the electrical interconnection, low testing coverage, etc. Therefore, there is a continuous need to modify the structure and manufacturing method of the devices in the electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
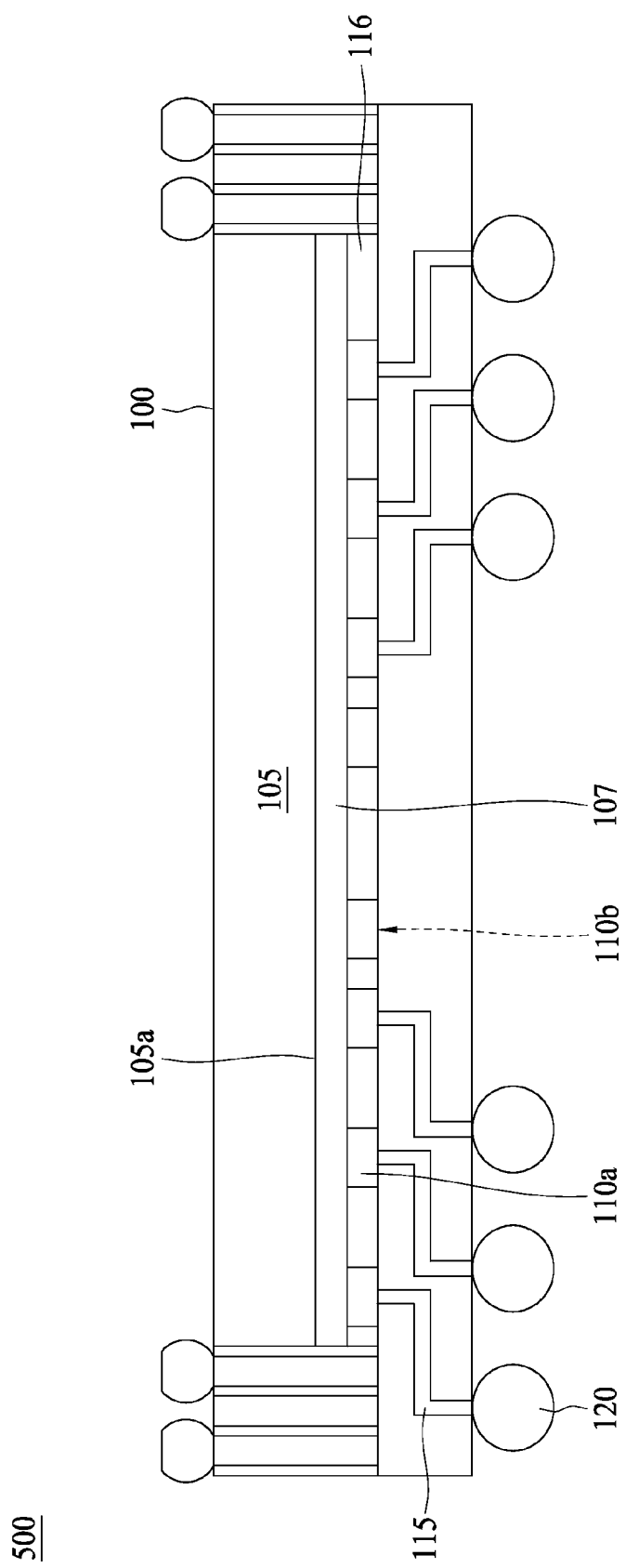
FIG. 1 is a schematic diagram showing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, an embedded circuit is built in a semiconductor device and electrically coupled to a small conductive pad. The conductive pad is arranged in the semiconductor device as a probing pad and some characteristics such as current leakage or operation speed of the semiconductor device can be derived through the embedded circuit without applying a probing tip on the conductive pad. The conductive pad is small in size and a largest planar dimension (length, width, or diameter) of the conductive pad is not greater than about 40 um. In some embodiments, the conductive pad is arranged in a dense probing pad region, in which the smallest pad pitch is not greater than about 40 um. Through the embedded circuit, characteristics such as current leakage or operation speed can be acquired before building the semiconductor into a package.

In FIG. 1, a semiconductor device 100 is assembled into a package 500 in accordance with some embodiments. In some embodiment, semiconductor device 100 is a chip. Semiconductor device 100 has a semiconductive substrate 105. An active surface 105a of semiconductive substrate 105 includes some electrical components such as transistors, resistance, diodes, and MOSFETs. There may be some donor or acceptor type doped regions or junctions placed around surface 105a. An interconnect 107 is disposed on surface 105a and includes conductive traces and dielectric. Conductive traces (not shown) are connected with the electrical components at one end and connected with conductive pads 110 (110a and 110b). A conductive redistribution layer 115 is optionally disposed and electrically coupled with pads 110. In some embodiments, conductive pads 110 are I/O (input/output) pads. Some conductive bumps 120 are connected to conductive redistribution layer 115.

In some embodiments, each of pads 110 has a surface partially exposed from a top dielectric 116 of interconnect 107. Top dielectric 116 is the upper most level dielectric of semiconductor device 100. The exposed area of pad 110 is configured as a probing area for an electrical test, such as a wafer level acceptance test or die yield test. Some pads, like pad 110a, are arranged in a loose region in which a pad pitch is at least greater than 40 um. Pad pitch is a length measured from a geometric center of a pad surface to an adjacent pad's geometric center. Pads in the loose region are configured to be probed during a test. At least a probe mark may be observed on the exposed surface of large pitch pad 110a.

Some pads, like pad 110b, are arranged in a dense region in which the pad pitch is not greater than about 40 um. In such a dense region, the pad to pad distance is smaller and is more challenging to be probed by an external probe because the pad pitch may be smaller or close to the size of a probe tip. The room for accommodating a probe is too small and a neighboring pad may be unintentionally damaged by the probe. In some embodiments, the exposed surface of small pitch pad 110b is free of any probe mark.

In some embodiments, a width of pad 110b is smaller or not larger than the probe tip. For example, a diameter of the probe tip is around 100 um and the pad width is not greater than 40 um. The pad width is too small to receive the probe. In some embodiments, the diameter of the probe tip is around 30 um and the pad width is not greater than 40 um. However, even if the pad width is greater than the probe tip, the working tolerance (if evenly probed, only 5 um per side) for probing is small. Small pitch or small size pad 110b is also called un-probed pad in the present disclosure.

Pad 110b is electrically coupled to some electrical components around active surface 105a through interconnect 107. Performance such as current leakage, saturation current, breakdown voltage, or operation speed of the electrical components can be diagnosed through pad 110b. Instead of applying an external probe on pad 110b to identify the performance, an un-probed pad is tested through a test circuit embedded in semiconductor device 100. The un-probed pad is electrically coupled to at least an electrical component around surface 105a through a conductive trace in interconnect 107 and also electrically coupled to the test circuit through another conductive trace in interconnect 107.

Figure 2:
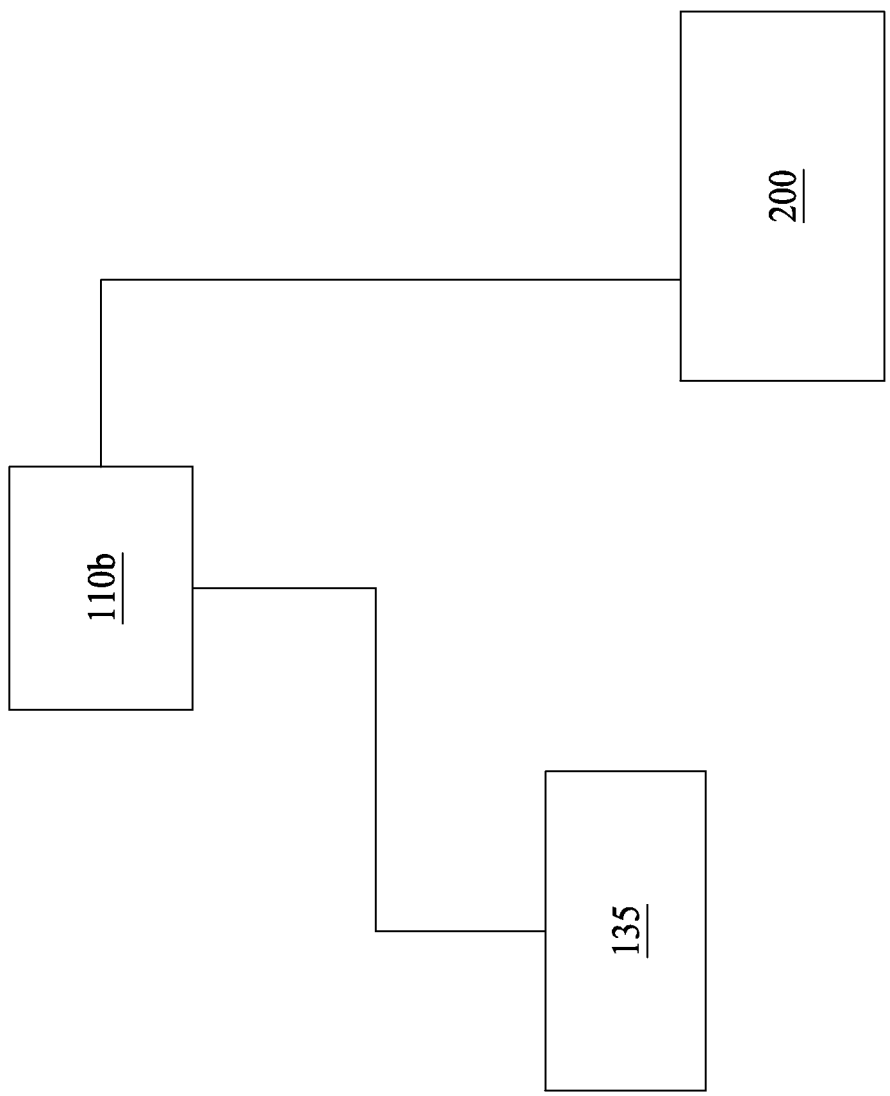
FIG. 2 is a schematic drawing showing an arrangement of an un-probed pad in accordance with some embodiments.
Figure 3:
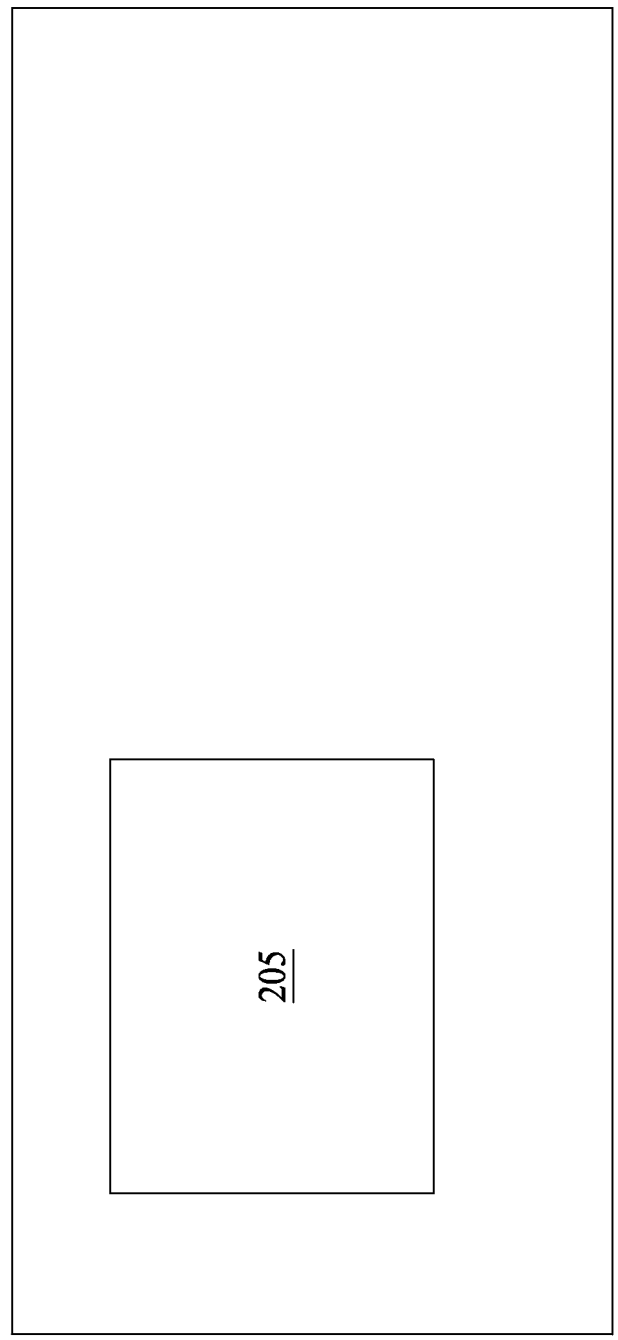
FIG. 3 is an enlarged view of a test circuit in accordance with some embodiments.

FIG. 2 is a schematic drawing showing an arrangement of an un-probed pad 110b, in accordance with some embodiments. Pad 110b is electrically coupled to an electrical component 135 in semiconductor device 100 and in parallel coupled to a test circuit 200 embedded in semiconductor device 100. Pad 110b is an I/O terminal of electrical component 135. A bias can be applied on electrical component 135 through pad 110b and an electrical signal can be detected by test circuit 200. FIG. 3 is an enlarged view of test circuit 200 according to some embodiments. Test circuit 200 includes at least a current sensor 205 electrically coupled with pad 110b through a conductive trace or a conductive via.

Figure 4A:
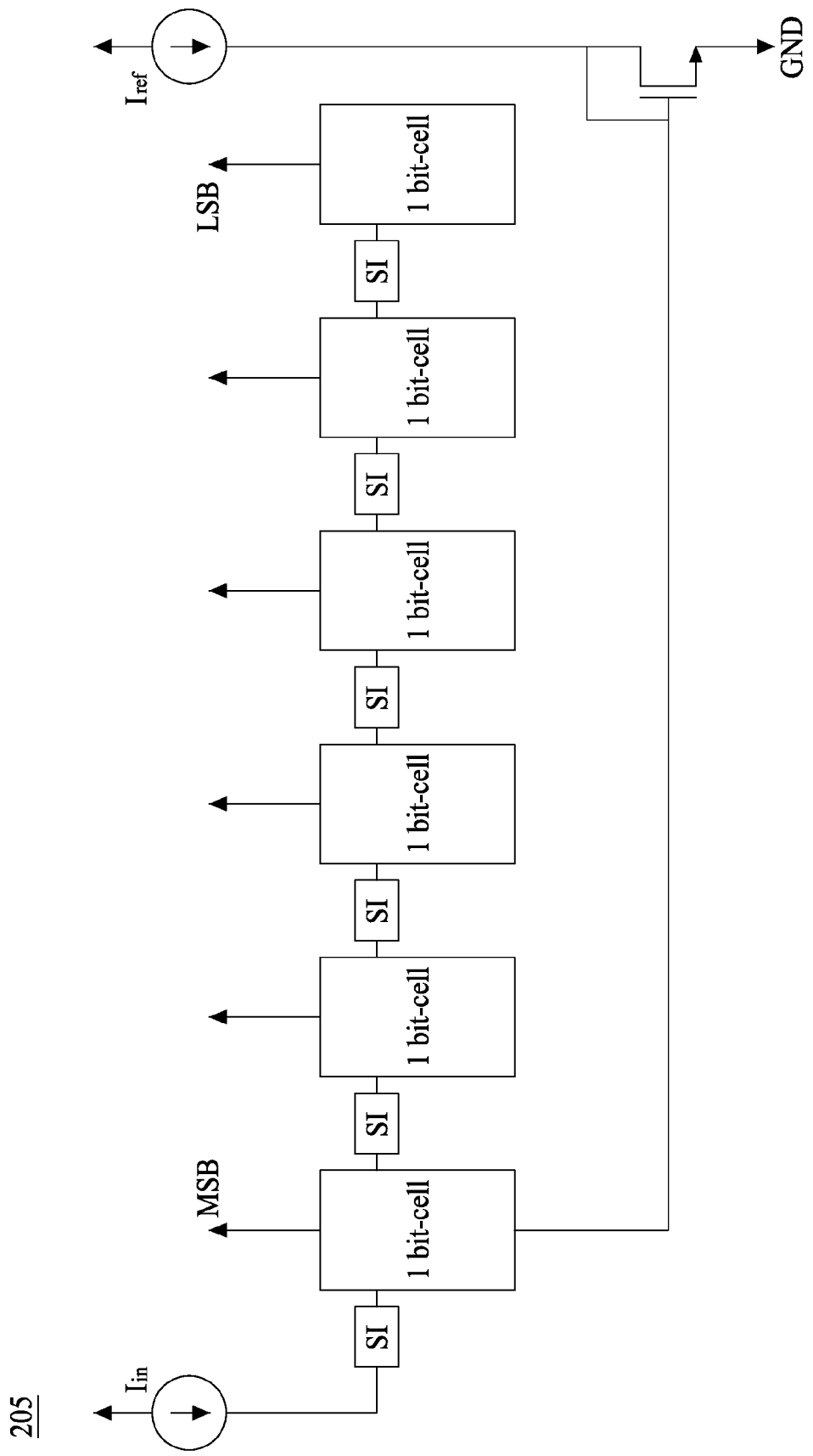
FIG. 4A is a schematic diagram of a 6-bit current sensor in accordance with some embodiments.
Figure 4B:
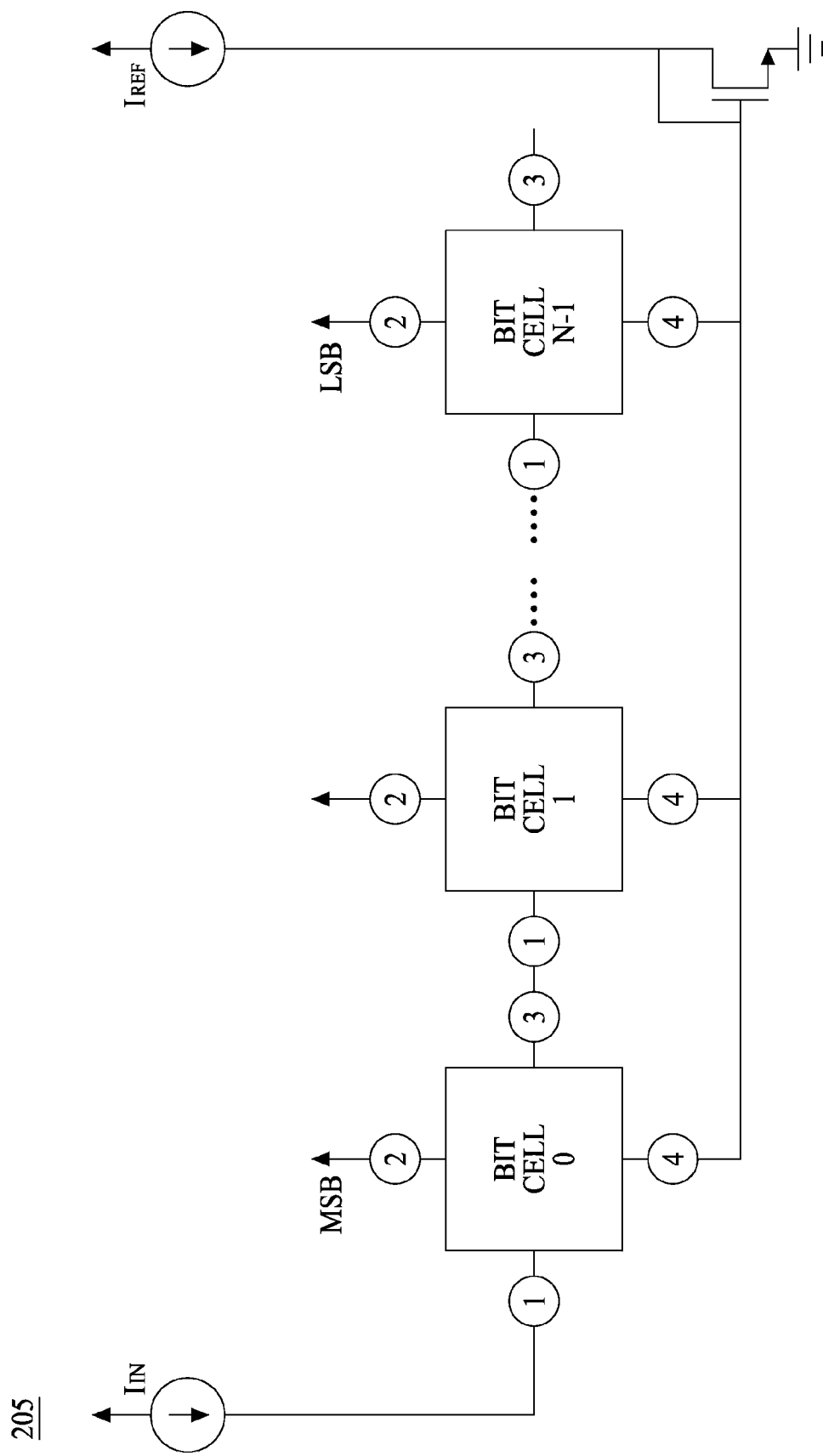
FIG. 4B is schematic diagram of a multi-bit current sensor in accordance with some embodiments.

Referring to FIG. 4A, current sensor 205 in an embodiment is a 6-bit current sensor. Current sensor 205 can detect the current flowing from pad 110b. FIG. 4B is a multi-bit current sensor according to some embodiments. Various current sensors can be adopted and the embodiments in FIGS. 4A and 4B are not deemed as a restriction.

Figure 5:
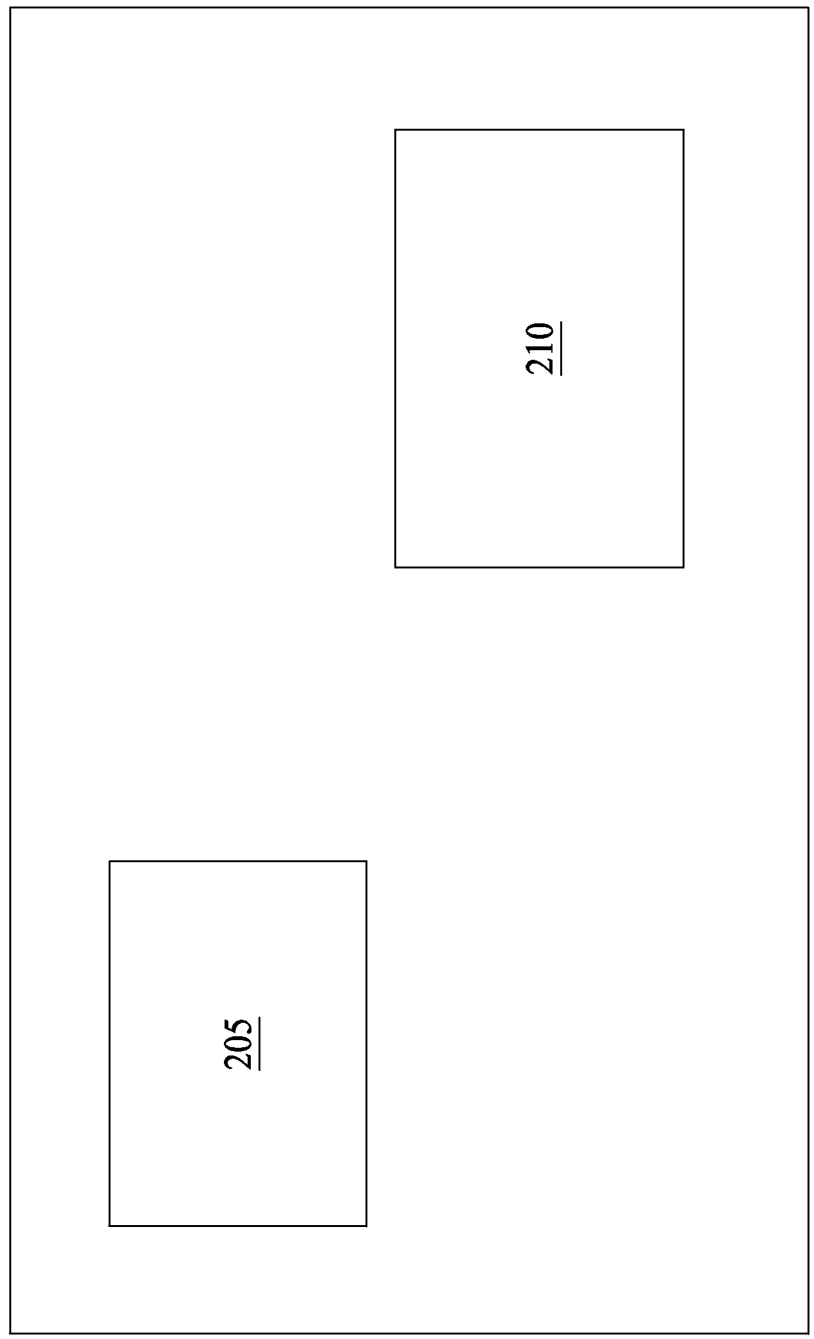
FIG. 5 is a schematic diagram of a test circuit in accordance with some embodiments.

Referring to FIG. 5, according to some embodiments, test circuit 200 further includes a speed diagnosis module 210. Speed diagnosis module 210 is configured to measure the operation speed of electrical component 135.

Figure 6:
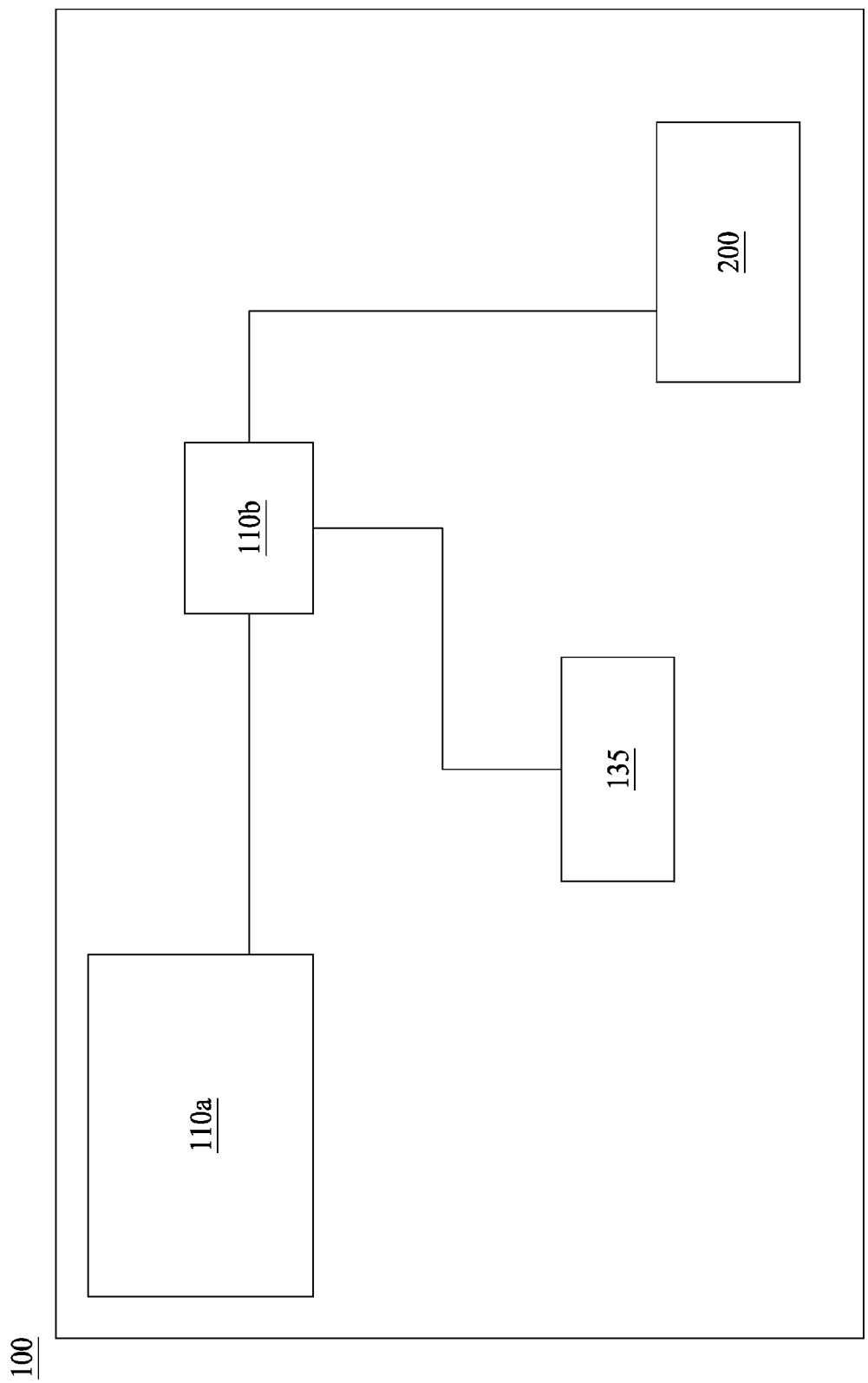
FIG. 6 is a schematic diagram showing a semiconductor device in accordance with some embodiments.

In some embodiments, a small pad is further electrically coupled to a pad with a width larger than 40 um. As shown in FIG. 6, pad 110b is electrically coupled with pad 110a, which has a larger dimension than pad 110b and 40 um. Pad 110b can be electrically coupled with pad 110a through a conductive trace in the same tier (or level) or a lower tier. Pad 110a is more feasible to receive a probe during a test such that a bias can be transmitted to un-probed pad 110b through probed pad 110a. In some embodiments, a small pitch pad is further electrically coupled to a pad in a larger pitch region. A pad in a region with a pitch not greater than 40 um is rerouted through a conductive trace in interconnect 107 (referring to FIG. 1) and coupled with another pad in a region with a pitch greater than 40 um.

Pad 110b is also coupled with electrical component 135 in semiconductor device 100. Through pad 110b, some electrical characteristics of component 135 can be diagnosed. Although pad 110b is not configured to receive a probe due to the small pad size or pad pitch, pad 110a provides a contact for an external probe. In other words, the operation performance of component 135 can be diagnosed through probing pad 110a via the connection between pad 110b and 110a.

Figure 7:
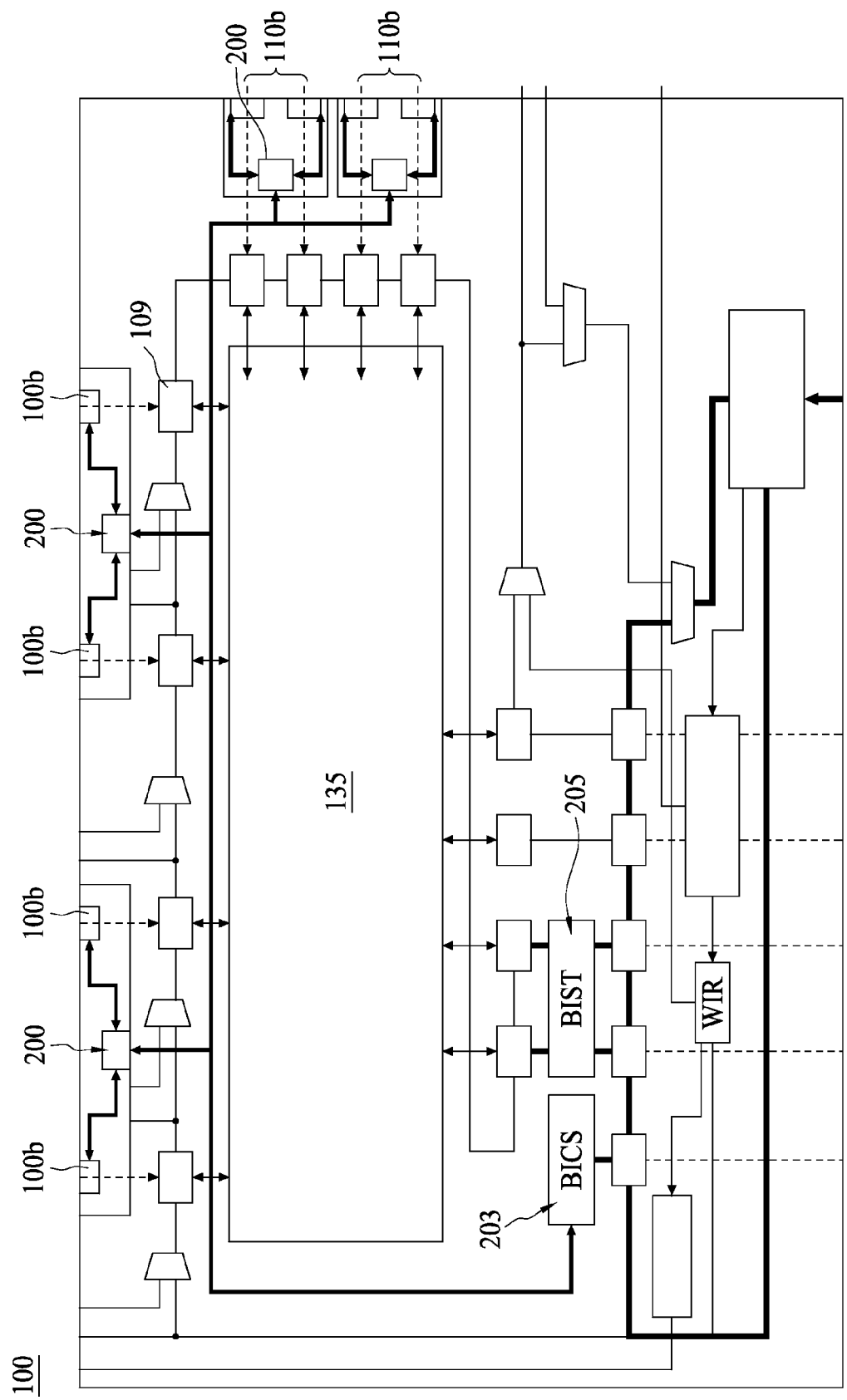
FIGS. 7-10 are schematic diagrams showing a known good die (KGD) in accordance with some embodiments.

Referring to FIG. 7, a known good die (KGD) 100 is illustrated in accordance with some embodiments. Un-probed pads 110b are arranged to be electrically coupled with component 135 through embedded interconnect or device 109. Each pair of un-probed pads 110b is electrically coupled with test circuit 200. In some embodiments, test circuit 200 is a current sensor and can be coupled to more than two un-probed pads 110b. Another circuit 203 is electrically coupled to current sensor 200. Circuit 203 is a built in current sensor (BICS) configured to detect current leakage of component 135. Further, KGD 100 includes a circuit 205. In some embodiments, circuit 205 is a built in self-test circuit (BIST) configured to detect the operation speed of component 135. In some embodiments, circuit 205 is configured for at speed functional test. Both of BICS and BIST are embedded in die 100 and used for performance diagnosis. BICS and BIST can operate simultaneously or individually. In some embodiments, device 109 is configured as some reference units such as wrapper.

Figure 8:
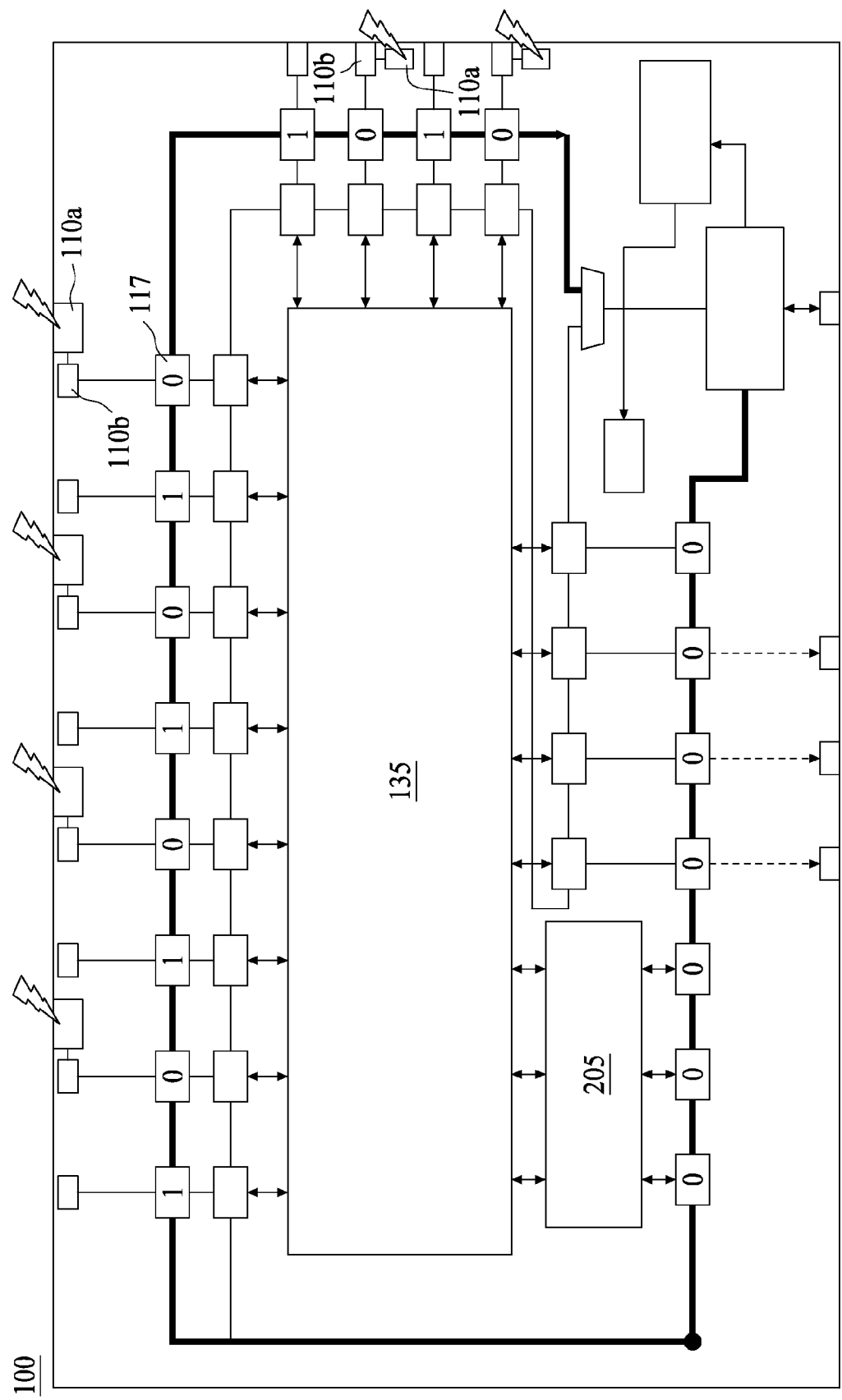

Referring to FIG. 8, a schematic diagram of KGD 100 is illustrated in accordance with some embodiments. Some un-probed pads 110b are individually electrically coupled with a probed pad 110a. Un-probed pad 110b is smaller than a neighboring probed pad 110a. In some embodiments, each un-probed pad 110b is less than about 30 um and coupled to a unit 117. Unit 117 can be configured as a scan cell and coupled with a BIST 205. BIST 205 is configured to diagnose some electrical characteristics of component 135. When a test operation is performed, probed pad 110a is a terminal to be in contact with a probe. Electrical characteristics associated with an even or odd un-probed pad 110b can be tested by a corresponding probed pad 110a. In some embodiments, such arrangement of probed and non-probed pad is also called even/odd probing.

Figure 9:
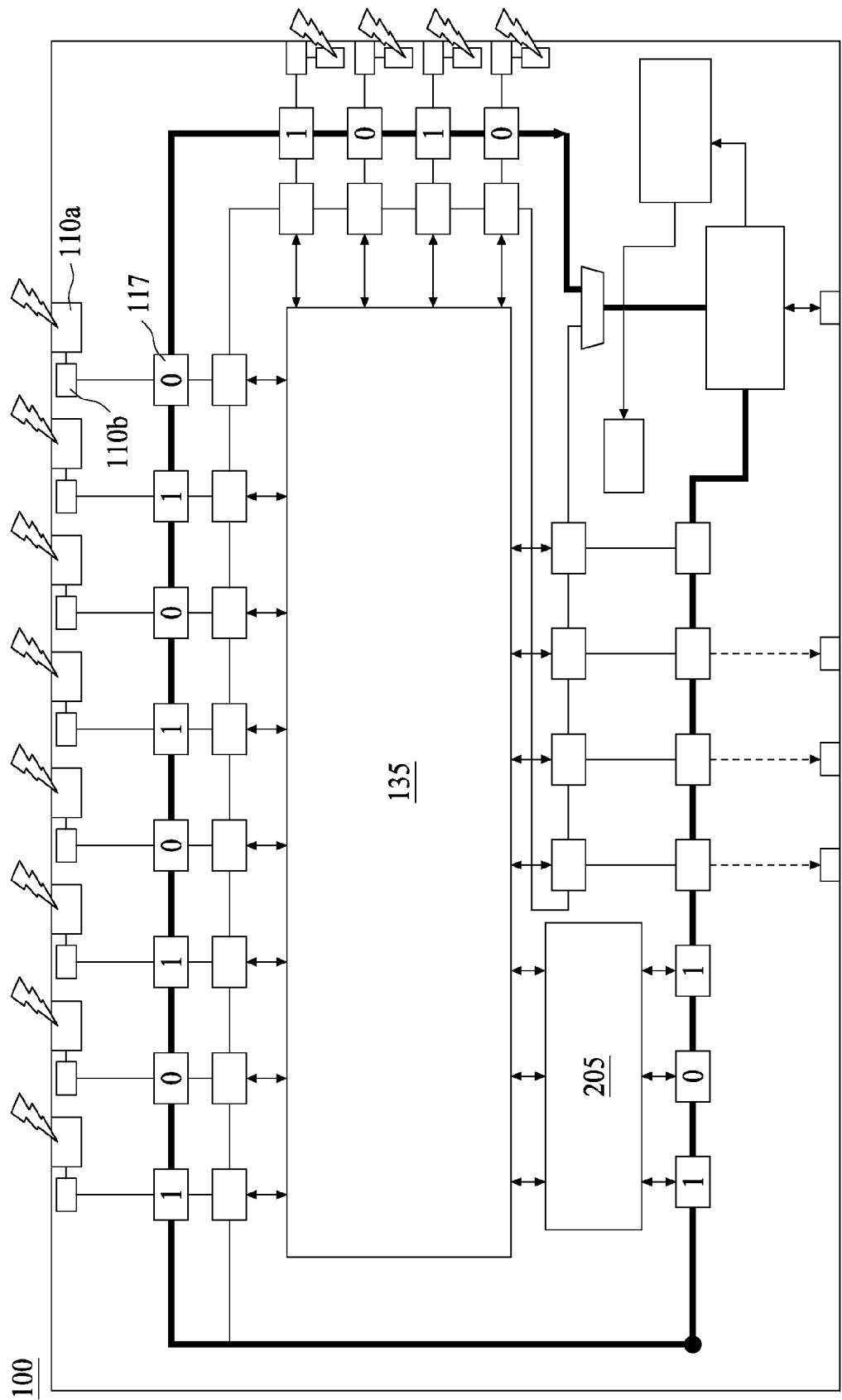

Referring to FIG. 9, a schematic diagram of KGD 100 is illustrated in accordance with some embodiments. Each un-probed pads 110b is electrically coupled and accompanied with a probed pad 110a. Un-probed pad 110b is smaller than a neighboring probed pad 110a. In some embodiments, each un-probed pad 110b is less than about 30 um and coupled to unit 117. Unit 117 can be configured as a scan cell and coupled with a BIST 205. BIST 205 is configured to diagnose some electrical characteristics of component 135. When a test operation is performed, probed pad 110a is a terminal to be in contact with a probe. Electrical characteristics associated with each pad 110*b* can be tested by a different corresponding probed pad 110*a*. In some embodiments, such arrangement of probed and non-probed pad is also called multi-probing.

Figure 10:
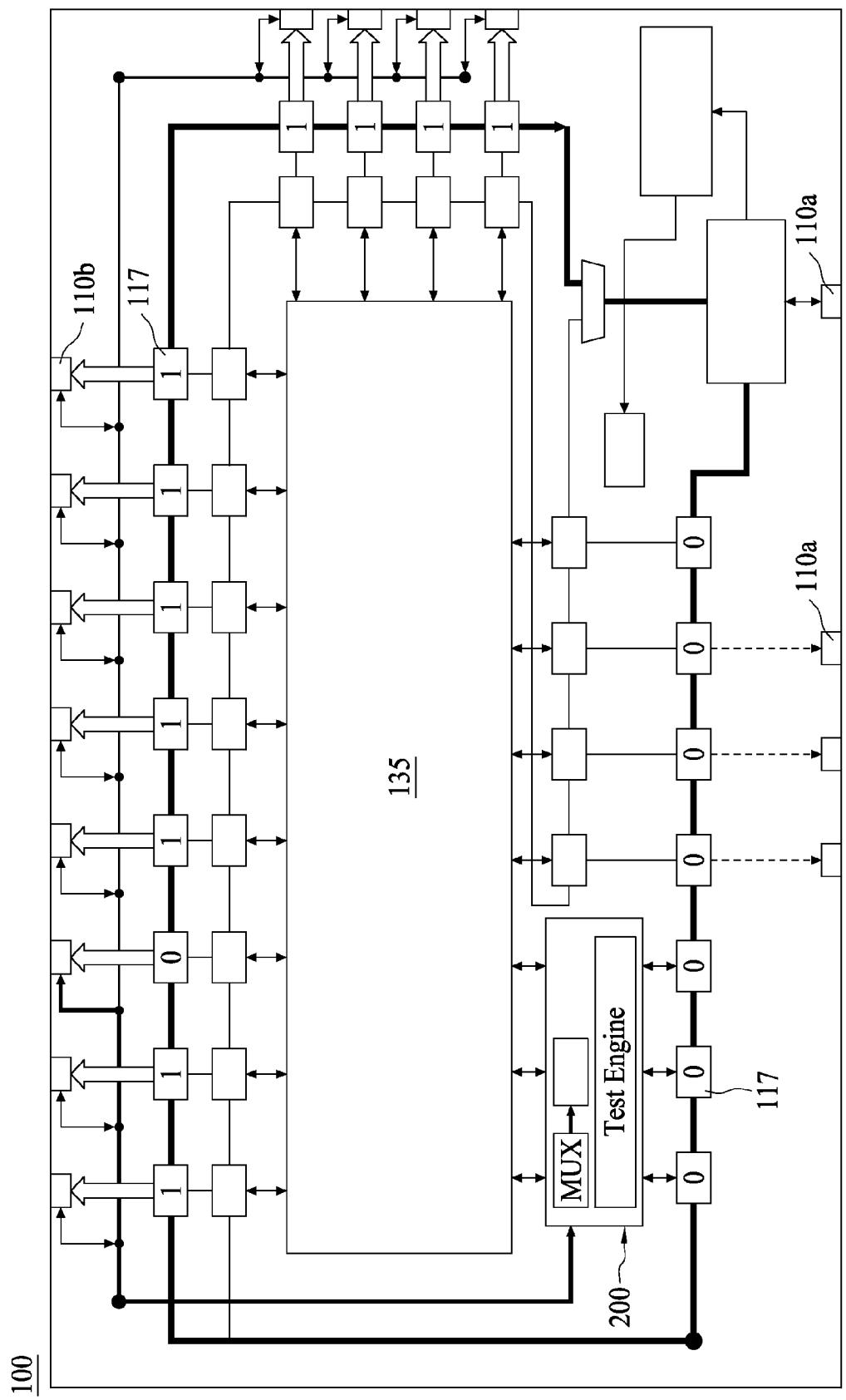

Referring to FIG. 10, a schematic diagram of KGD 100 is illustrated in accordance with some embodiments. Die 100 includes some un-probed pads 110*b* and some probed pads 110*a*. Each un-probed pad 110*b* is indirectly coupled with test circuit 200 through unit 117. In some embodiments, unit 117 can be configured as a scan cell. Test circuit 200 can include a multiplexer (MUX), test engine or current sensor. Test circuit 200 is further coupled with component 135 at one end and coupled with another unit 117 at another end. Through unit 117, test circuit 200 is indirectly coupled with a probed pad 110*a*. When the test probe is too large to apply on un-probed pad 110*b*, probed pad 110*a* can be configured as a terminal to be in contact with the test probe. Therefore, the electrical characteristics associated with each un-probed pad 110*b* can be derived through probing one corresponding probed pad 110*a*. In some embodiments, such arrangement of probed and non-probed pad is also called one-to-multi-probing. In some embodiments, such arrangement is for testing current leakage.

Figure 11A:
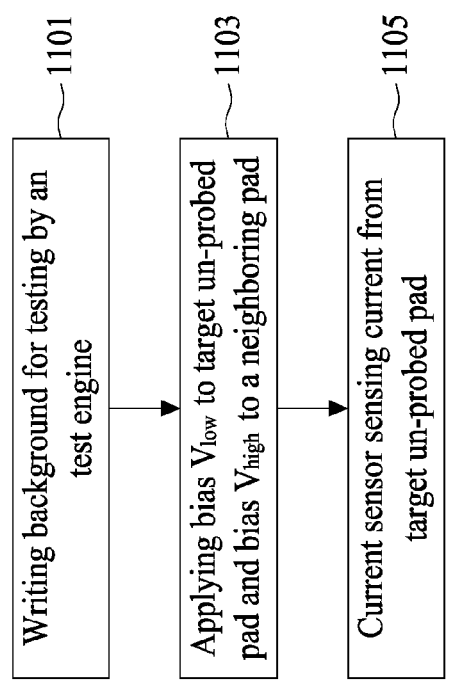
FIG. 11A is a flow diagram showing a testing method in accordance with some embodiments.
Figure 11B:
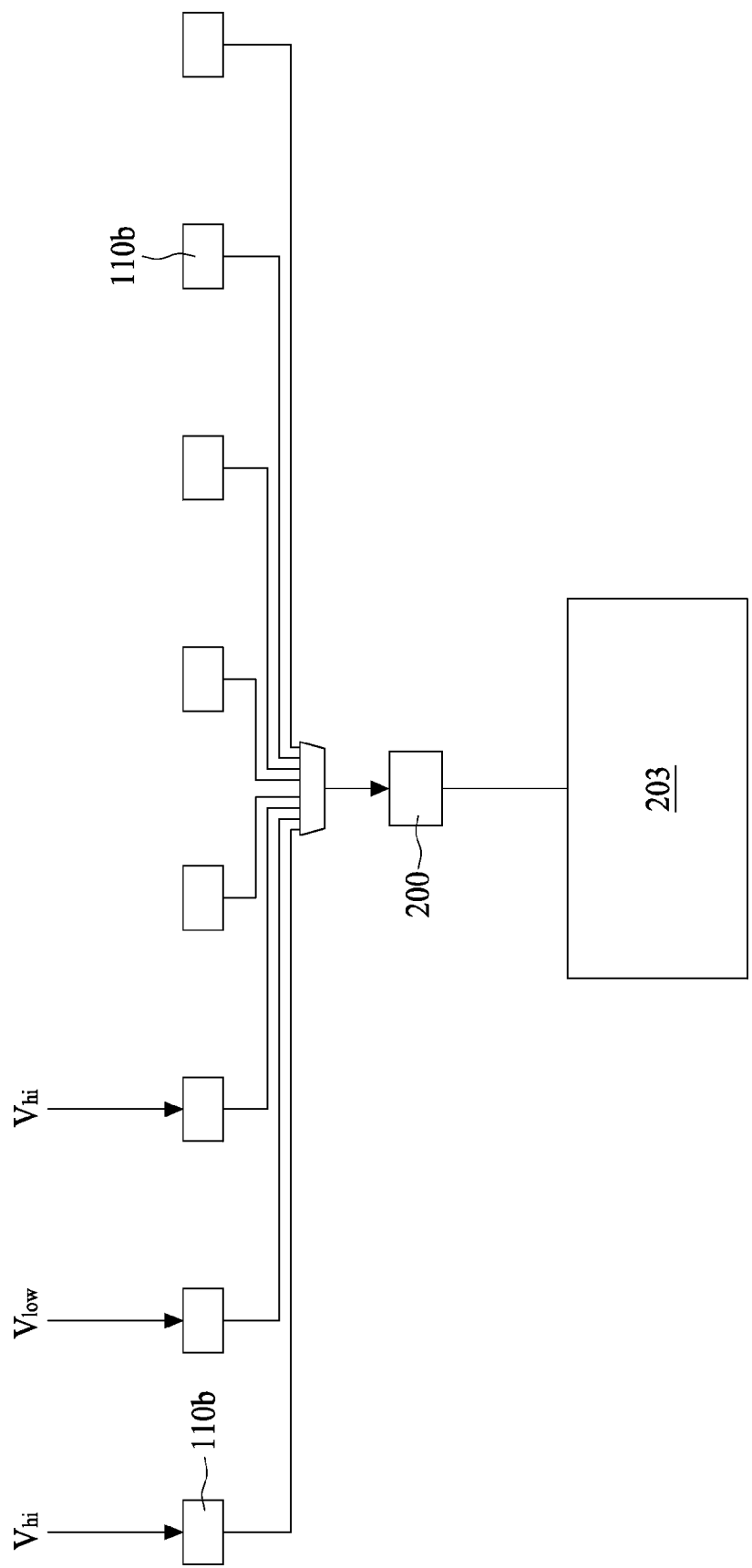
FIGS. 11B-11D are schematic diagrams showing operational steps for the testing method of FIG. 11A, in accordance with some embodiments.

The configuration of KGD 100 can be used to perform various tests. Some exemplary methods are described in the following embodiments. FIG. 11A is a flow chart of a testing method performed on un-probed pads of a KGD 100 in FIG. 11B. In FIG. 11B, current sensor 200 is coupled with a plurality of small sized or small pitch pads 110*b*. Each un-probed pad 110*b* is independently coupled to a probed pad (not shown in the present drawing) as shown in FIG. 9. Each probed pad corresponding to an un-probed pad is independently coupled to current sensor 200. A bias Vlow is indirectly applied to a target un-probed pad through a corresponding probed pad. Each unselected un-probed pad neighboring to the target un-probed pad receives a bias Vhigh, which is greater than Vlow, through a coupled probed pad. If there is a leakage from the component associated with the target un-probed pad, a leakage current signal is transferred to current sensor 200 or BICS 203. In some embodiments, the neighboring pad can be a probed pad.

Figure 11C:
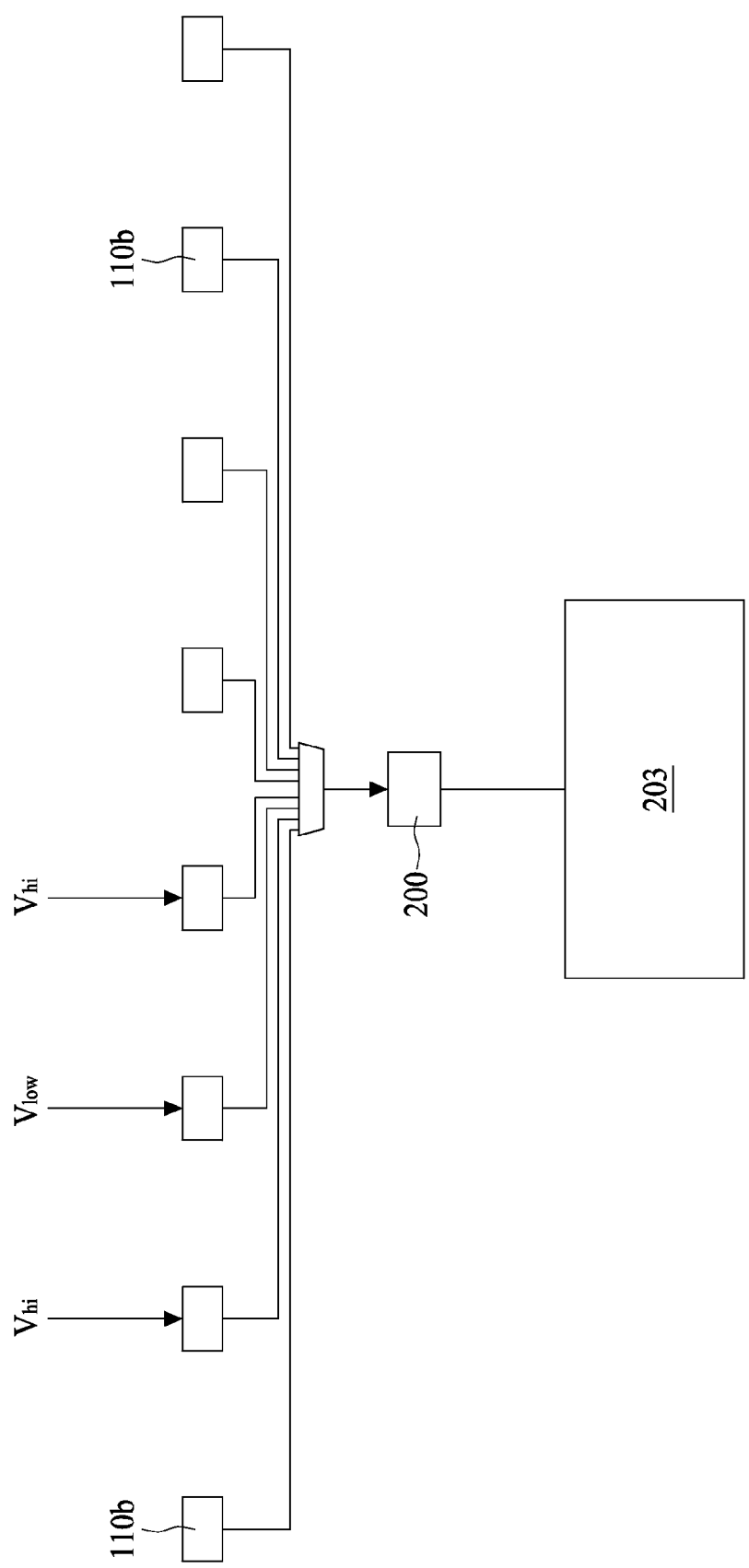

In FIG. 11C, each probed pad corresponding to an un-probed pad is independently coupled to current sensor 200. The target un-probed pad is shifted to a pad which is neighboring to the target pad in FIG. 11B. A bias Vlow is indirectly applied to the target un-probed pad through a corresponding probed pad. Each unselected un-probed pad neighboring to the target un-probed pad receives a bias Vhigh, which is greater than Vlow, through a coupled probed pad. If there is a leakage from the component associated with the target un-probed pad, a leakage current signal is transferred to current sensor 200 or BICS 203.

Figure 11D:
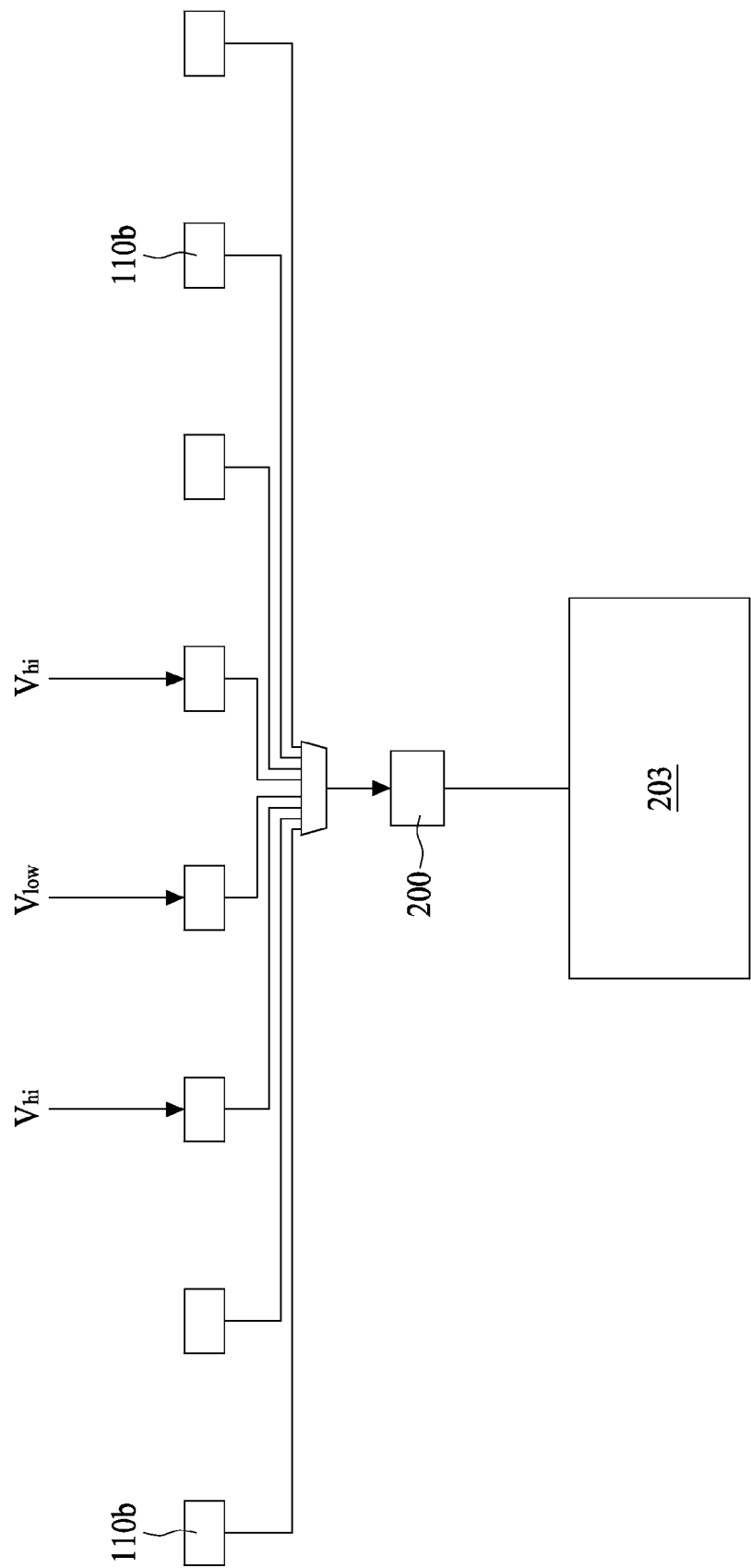

In FIG. 11D, each probed pad corresponding to an un-probed pad is independently coupled to current sensor 200. The target un-probed pad is shifted to a pad which is neighboring to the target pad in FIG. 11C. A bias Vlow is indirectly applied to the target un-probed pad through a corresponding probed pad. Each unselected un-probed pad neighboring to the target un-probed pad receives a bias Vhigh, which is greater than Vlow, through a coupled probed pad. If there is a leakage from the component associated with the target un-probed pad, a leakage current signal is transferred to current sensor 200 or BICS 203.

Leakage test performed in FIG. 11A includes at least the following operations. In operation 1101, a test engine starts to write background information as a reference in a queue for testing result comparison. In operation 1103, an un-probed pad is selected as a target pad and a Vlow bias is applied on the target pad. A pad neighboring to the target pad is biased with Vhigh, which is greater than Vlow. In operation 1105, a current flowing through the target pad is detected by a current sensor. In some embodiments, the current detected by the current sensor is calculated to determine if the magnitude is greater than a threshold value. If the magnitude is greater than the threshold value, there is a leakage from the electrical component coupled to the target pad. Operation 1101 to operation 1105 can be repeated for different target un-probed pads. Each electrical component built in semiconductor device 100 in FIG. 1 can be diagnosed through an associated pad, even if the associated pad is an un-probed pad. In some embodiments, the background information written into the queue may be refreshed before applying bias on a new target un-probed pad.

Figure 12A:
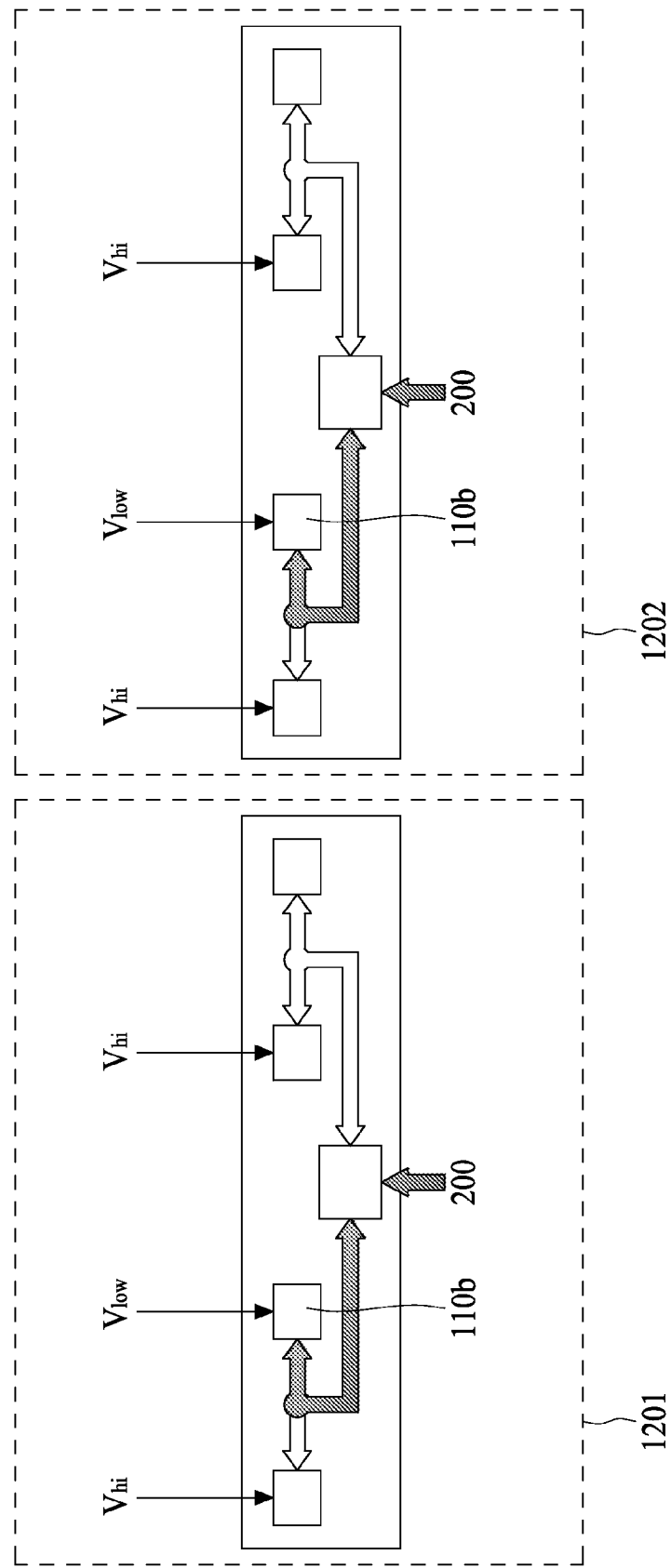
FIGS. 12A and 12B are schematic diagrams showing a testing method in accordance with some embodiments.
Figure 12B:
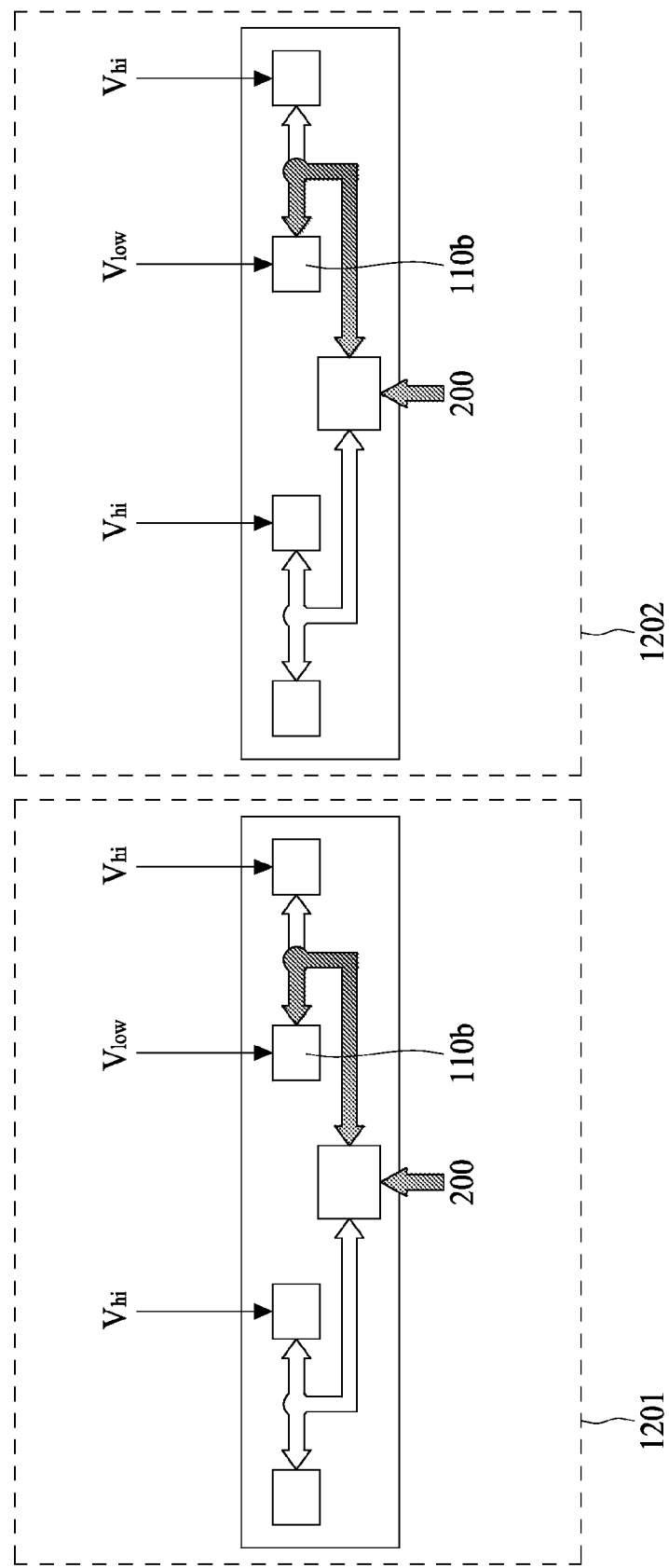

The method in FIG. 11A can be applied to a different test scheme as shown in FIGS. 12A and 12B. In FIG. 12A, the un-probed pads 110*b* are grouped into at least two different groups, 1201 and 1202. Each group includes at least one current sensor 200. Current sensor 200 is coupled to several un-probed pads 110*b*. Test operations can be done in a parallel manner and performed on groups 1201 and 1202 simultaneously.

Each un-probed pad 110*b* is independently coupled to a probed pad (not shown in the present drawing) as shown in FIG. 9. Each probed pad corresponding to an un-probed pad is independently coupled to current sensor 200. In FIG. 12A, a bias Vlow is indirectly applied to a left side target un-probed pad through a corresponding probed pad. Each unselected un-probed pad neighboring to the target un-probed pad receives a bias Vhigh, which is greater than Vlow, through a coupled probed pad. If there is a leakage from the component associated with the target un-probed pad, a leakage current signal is transferred to current sensor 200 or a BICS. In some embodiments, the neighboring pad can be a probed pad. The target un-probed pad can be reselected and shifted to another un-probed pad on the left side.

In FIG. 12B, a bias Vlow is indirectly applied to a right side target un-probed pad through a corresponding probed pad. Each unselected un-probed pad neighboring to the target un-probed pad receives a bias Vhigh, which is greater than Vlow, through a coupled probed pad. If there is a leakage from the component associated with the target un-probed pad, a leakage current signal is transferred to current sensor 200 or a BICS. The target un-probed pad can be reselected and shifted to another un-probed pad on the right side.

By adopting aforementioned designs and testing operations, the testing coverage of semiconductor die 100 can be improved. In some embodiments, 100% of pads disposed in semiconductor die 100 can be probed directly or indirectly, even if the pad width is smaller than 30 um or the pad pitch is smaller than 40 um. Therefore, the built in components in semiconductor die 100 can be diagnosed at a front end stage before being put into a package.

Figure 13:
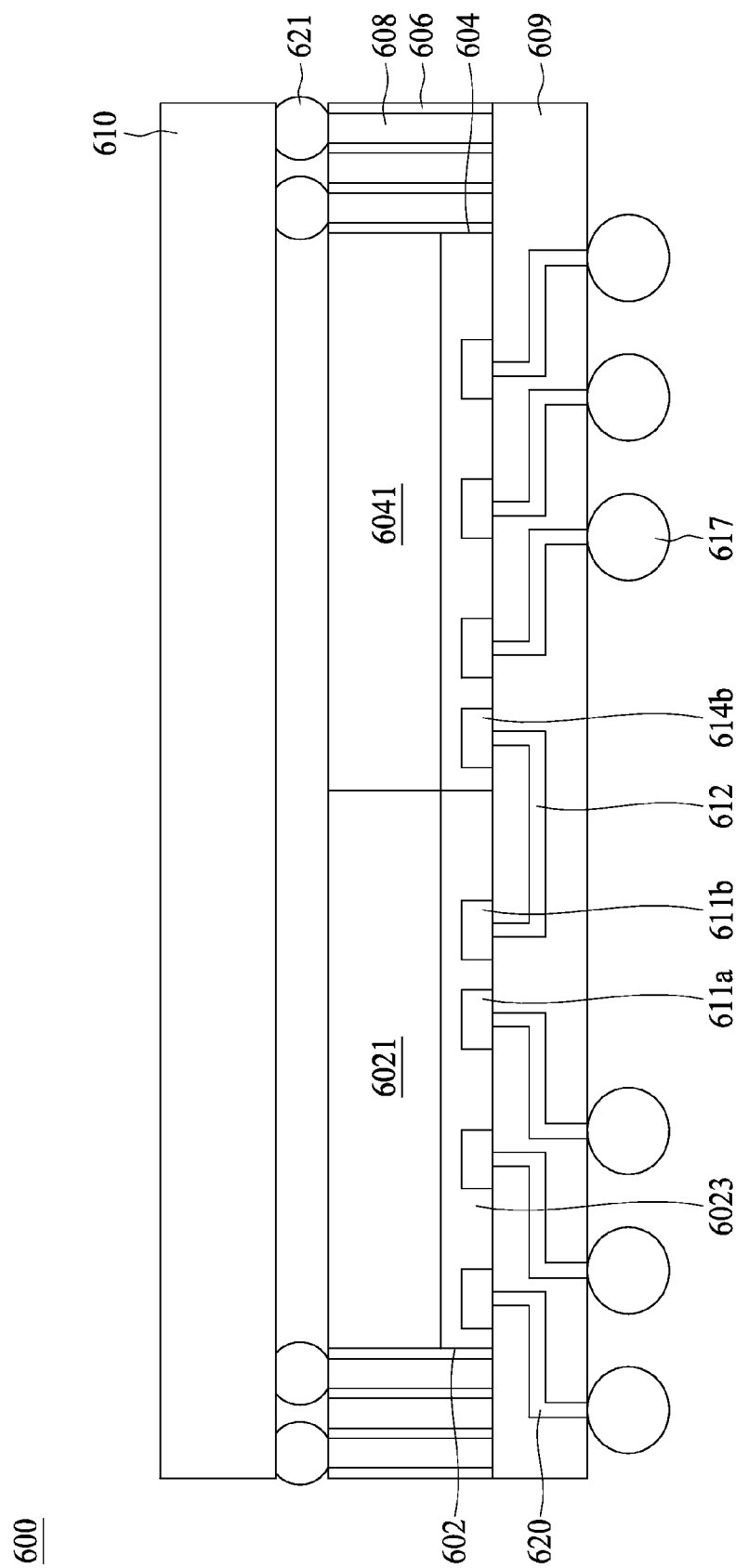
FIG. 13 is a schematic diagram showing a fan-out semiconductor package in accordance with some embodiments.

Referring to FIG. 13, a fan-out semiconductor package 600 is illustrated in accordance with some embodiments. Package 600 has at least two different semiconductor devices disposed laterally on the same tier. Semiconductor die 602 is disposed adjacent to semiconductor die 604. Another semiconductor die 610 is disposed on a different tier and over dies 602 and 604. Die 610 is electrically coupled to dies 602 and 604 by conductive through dielectric via (TDV) 608. Die 602 includes semiconductive substrate 6021, which has some built in semiconductor components such as a MOSFET, diode, etc. An interconnect 6023 is disposed on a semiconductive substrate 6021. Interconnect 6023 includes conductive traces, vias, or some dielectric layers between different layers of conductive traces. Interconnect 6023 also includes a dielectric on an upper most level. The upper most level dielectric may be formed by vapor deposition or spin coating. "Vapor deposition" refers to processes of depositing materials on a substrate though the vapor phase. Vapor deposition processes include any process such as, but not limited to, chemical vapor deposition (CVD) and physical vapor deposition (PVD). Examples of vapor deposition methods include hot filament CVD, radio-frequency CVD (rf-CVD), laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), Plasma-enhanced CVD (PECVD), high-density plasma CVD (HDPCVD), low-pressure CVD (LPCVD) and the like. In some embodiments, the upper most level dielectric includes silicon oxide or silicon nitride. The upper most level dielectric is also configured as a passivation layer of die 602.

Die 602 also includes several conductive pads 611a or 611b disposed in interconnect 6023. Pads 611a and 611b are partially exposed from the upper most level dielectric. Pads 611a and 611b are also configured as contacts of die 602 to connect or bond with a conductor or conductive pillar that is external to interconnect 6023. Pad 611a has a greater dimension or pad pitch than pad 611b. Pad 611a is a probed pad and pad 611b is a non-probed pad. In some embodiments, a current sensor (not shown) is connected to non-probed pad 611b. The current sensor may be a structure disposed with non-probed pad 611b on the same level of interconnect 6023. In some embodiments, the current sensor is a circuit and electrically coupled to active semiconductor components (MOSFET, diode, etc.), which are built in semiconductive substrate 6021. The current sensor may include a conductive trace, which is extended to be connected with non-probed pad 611b. In some embodiments, the current sensor includes a converter to output a current to a digital signal. In some embodiments, non-probed pad 611b is configured as an input or an output pad.

Die 602 and die 604 are integrated in a single package and communicated with at least one conductive trace 612. Dielectric 606 is disposed to enclose dies 602 and die 604. In some embodiments, dielectric 606 includes a molding material. The molding material is a compound and formed with composite materials including epoxy resins, phenolic hardeners, silicas, catalysts, pigments, and mold release agents. The molding material that is adopted for forming a molding compound has a high thermal conductivity, a low moisture absorption rate, a high flexural strength at board-mounting temperatures, or a combination of all.

Die 602 and die 604 are both known good die (KGD) and are electrically coupled by at least conductive trace 612. In some embodiments, a non-probed pad 614b of die 604 is electrically coupled with a non-probed pad 611b of die 602. In some embodiments, conductive trace 612 is a portion of a redistribution layer (RDL) or post passivation interconnect (PPI) 620 of fan-out semiconductor package 600. RDL or PPI 620 is configured to fan-out the crowded pads in dies 602 and 604 to a different level with a bigger area to increase the room for layout.

Polymeric layer 609 is disposed between conductive trace 612 and the upper most level dielectric. In some embodiments, polymeric layer 609 includes polymer material such as epoxy, polyimide, polybenzoxazole (PBO), and the like. In some embodiment, the dielectric is disposed on the semiconductor chip that is placed in the 3D semiconductor structure. The dielectric can be also formed with dielectric materials, such as spin-on glass (SOG), silicon oxide, silicon oxynitride, or the like, by any suitable method such as spin coating or vapor deposition.

Polymeric layer 609 may be a single layer or a composite structure. In some embodiments, polymeric 609 includes several levels such as RDL or PPI 620 in order to form a multi-level structure. A conductive bump 617 is disposed at an outer surface of the polymeric layer 609. In some embodiments, conductive bump 617 is a solder ball or paste placed on RDL or PPI 620 so that the 3D fan-out semiconductor package 600 can be electrically connected to an external device. In some embodiments, an under-bump metallurgy (UBM) is formed between each conductive bump 617 and RDL or PPI 620. The UBM may be a conductive material such as gold, silver, copper, nickel, tungsten, aluminum, and/or alloys thereof.

A different conductive bump 621 is optionally disposed on a surface which is different from where conductive bump 617 is disposed. In some embodiments, conductive bump 621 is disposed between TDV 608 and die 610. TDV 608 can be further electrically coupled to die 604 or 604 through RDL or PPI 620.

In the present disclosure, a semiconductor device is provided which comprises a semiconductive substrate and an interconnect on the substrate. The interconnect comprises a dielectric in an upper most level of the interconnect and a plurality of conductive pads where each of the plurality of conductive pads is at least partially exposed from the dielectric. The interconnect further includes a current sensor electrically coupled with at least one of the plurality of conductive pads.

In some embodiments, the current sensor is at the same level of the interconnect as the plurality of conductive pads. In some embodiments, the plurality of conductive pads are bonded with a conductor. In an embodiment, the current sensor is electrically coupled to a semiconductive component in the semiconductive substrate. In an embodiment, the conductive pad electrically coupled with the current sensor has a width less than about 30 um.

In another embodiment, each of the plurality of conductive pads electrically coupled with the current sensor has a pitch with an adjacent pad less than about 40 um. In yet another embodiment, the current sensor includes a conductive trace extended to at least one of the plurality of conductive pads.

In the present disclosure, a semiconductor device is provided which comprises a first die and a second die electrically communicating with the first die. The semiconductor device also includes a dielectric enclosing the first die and the second die in an integrated package. At least one of the first die and the second die includes a semiconductive substrate and an interconnect on the substrate. The interconnect comprises a dielectric in an upper most level of the interconnect and a plurality of conductive pads wherein each of the plurality of conductive pads is at least partially exposed from the dielectric. The interconnect also includes a current sensor electrically coupled with at least one of the plurality of conductive pads.

In an embodiment, both of the first die and the second die are known good die (KGD). In an embodiment, a redistribution layer (RDL) is electrically coupled to at least one of the first die and the second die through at least one of the plurality of conductive pads.

In some embodiments, the semiconductor device further comprises a polymeric layer between the RDL and the dielectric. In an embodiment, at least one of the plurality of conductive pads electrically coupled with the current sensor has a width less than about 30 um. In some embodiments, each of the plurality of conductive pads electrically coupled with the current sensor has a pitch with an adjacent pad less than about 40 um.

In an embodiment, the current sensor comprises a converter to output a current to a digital signal. In some embodiments, each of the plurality of conductive pads electrically coupled with the current sensor is at least one of an input or an output pad.

In an embodiment, the semiconductor further comprises a conductive bump external to the dielectric, and the conductive bump is electrically connected to a redistribution layer (RDL), which is inside the dielectric.

In the present disclosure, a semiconductor device is provided. The semiconductor device comprises a semiconductive substrate and a first conductive pad over the semiconductive substrate, where a largest dimension of the first conductive pad is less than about 40 um. The semiconductor device further includes a circuit electrically coupled to the first conductive pad and the circuit is configured to detect current flowing through the first conductive pad.

In an embodiment, the semiconductor device further comprises a second conductive pad over the semiconductive substrate and at the same level of the first conductive pad. The second conductive pad is coupled to the circuit. In an embodiment, the circuit is configured to measure an operation speed of the semiconductor device. In another embodiment, a pitch between the first conductive pad and a pad adjacent to the first conductive pad is less than about 40 um.

What is claimed is:

1. A semiconductor device, comprising:
a semiconductive die;
an interconnect structure on the semiconductive die, the interconnect structure comprising:
 a dielectric in an upper most level of the interconnect structure;
 a plurality of conductive pads wherein each of the plurality of conductive pads is at least partially exposed from the dielectric; and,
 a multi-bit current sensor electrically coupled with the semiconductive die through
at least one of the plurality of conductive pads; and
a conductive bump conductively connected to the interconnect structure,
wherein the plurality of conducive pads comprise a plurality of probed pads and a plurality of un-probed pads, a pitch of the plurality of probed pads is greater than a pitch of the plurality of un-probed pads, and at least one of the plurality of probed pads is electrically connected to a corresponding one of the plurality of un-probed pads through a conductive trace.

2. The semiconductor device of claim 1, further comprising a redistribution layer covering the semiconductive die, wherein the conductive bump is conductively connected to the interconnect structure through the redistribution layer.

3. The semiconductor device of claim 1, wherein at least one the plurality of probed pads is conductively coupled to the current sensor through at least one of the plurality of un-probed pads.

4. The semiconductor device of claim 1, wherein the current sensor comprises a plurality of bit cells configured to output a multi-bit sensing result.

5. The semiconductor device of claim 1, wherein each of the plurality of probed pads is an input/output terminal configured to be in contact with a probe under a test operation.

6. The semiconductor device of claim 1, wherein each of the plurality of un-probed pads electrically coupled with the current sensor in parallel and has a pitch with an adjacent pad less than about 40 um.

7. The semiconductor device of claim 1, further comprising a second current sensor, wherein a first group of the plurality of the probed pads are coupled to the current sensor and a second group of the plurality of the un-probed pads are coupled to the second current sensor.

8. A semiconductor device, comprising:
a first die;
a second die in electrical connection with the first die;
a dielectric enclosing the first die and the second die in an integrated package,
wherein at least one of the first die and the second die includes:
 a semiconductive substrate; and,
 an interconnect structure on the substrate, the interconnect structure comprising;
  a dielectric in an upper most level of the interconnect structure;
  a plurality of conductive pads, wherein each of the plurality of conductive pads is at least partially exposed from the dielectric; and,
  a current sensor configured to detect current flowing through at least one of the plurality of conductive pads,
wherein the plurality of conducive pads comprise a plurality of probed pads and a plurality of un-probed pads, a pitch of the plurality of probed pads is greater than a pitch of the plurality of un-probed pads, and at least one of the plurality of un-probed pads is coupled to the current sensor through the interconnect structure.

9. The semiconductor device of claim 8, wherein both the first die and the second die are known good dice (KGD).

10. The semiconductor device of claim 8, wherein a redistribution layer (RDL) is electrically coupled to at least one of the first die and the second die through at least one of the plurality of conductive pads.

11. The semiconductor device of claim 10, further comprising a polymeric layer between the RDL and the dielectric.

12. The semiconductor device of claim 8, wherein at least one of the plurality of conductive pads electrically coupled with the current sensor has a width less than about 30 um.

13. The semiconductor device of claim 8, wherein each of the plurality of conductive pads electrically coupled with the current sensor has a pitch with an adjacent pad less than about 40 um.

14. The semiconductor device of claim 8, wherein the current sensor comprises a converter to output a current to a digital signal.

15. The semiconductor device of claim 8, wherein each of the plurality of conductive pads electrically coupled with the current sensor is at least one of an input or an output pad.

16. The semiconductor device of claim 8, further comprising a conductive bump external to the dielectric, wherein the conductive bump is electrically connected to a redistribution layer (RDL) which is inside another dielectric between the conductive bump and the plurality of conductive pads.

17. A semiconductor device, comprising:
a semiconductive die; and
an interconnect structure over the semiconductor die, the interconnect structure comprising:
   a first conductive pad at least partially exposed from the interconnect structure, wherein a largest dimension of the first conductive pad is less than about 40 um;
   a circuit electrically coupled to the first conductive pad, wherein the circuit is configured to detect current flowing through the first conductive pad; and
   a second conductive pad over the semiconductive die, wherein a smallest dimension of the second conductive pad is greater than about 40 um;
a conductive redistribution layer over the interconnect structure; and
a conductive bump over the conductive redistribution layer and conductively connected to the second conductive pad through the conductive redistribution layer,
wherein the first conductive pad is electrically couplable to a probe through the second conductive pad, the conductive redistribution layer and the conductive bump.

18. The semiconductor device of claim 17, further comprising a second conductive pad over the semiconductive die and at the same level of the first conductive pad, wherein the second conductive pad is electrically coupled to the circuit.

19. The semiconductor device of claim 17, wherein the circuit is configured to measure an operation speed of the semiconductor device.

20. The semiconductor device of claim 17, wherein a pitch between the first conductive pad and a pad adjacent to the first conductive pad is less than about 40 um.

* * * * *